(12) United States Patent
Kramer (10) Patent No.: US 11,461,222 B2
(45) Date of Patent: Oct. 4, 2022

(54) DETERMINING THE COMPLEXITY OF A TEST PROGRAM

(71) Applicant: Teradyne, Inc., North Reading, MA (US)

(72) Inventor: Randall Kramer, North Reading, MA (US)

(73) Assignee: TERADYNE, INC., North Reading, MA (US)

(*) Notice: Subject to any disclaimer, the term of this patent is extended or adjusted under 35 U.S.C. 154(b) by 223 days.

(21) Appl. No.: 16/850,156

(22) Filed: Apr. 16, 2020

(65) Prior Publication Data

US 2021/0326242 A1    Oct. 21, 2021

(51) Int. Cl.
*G06F 11/36* (2006.01)
*G06F 11/32* (2006.01)
*G06F 11/30* (2006.01)

(52) U.S. Cl.
CPC ...... *G06F 11/3684* (2013.01); *G06F 11/3075* (2013.01); *G06F 11/321* (2013.01); *G06F 11/3688* (2013.01); *G06F 11/3692* (2013.01)

(58) Field of Classification Search
CPC ............. G06F 11/3684; G06F 11/3075; G06F 11/321; G06F 11/3688; G06F 11/3692; G01R 31/2834; G01R 31/28–317
See application file for complete search history.

(56) References Cited

U.S. PATENT DOCUMENTS

| | | | |
|---|---|---|---|
| 4,808,915 A * | 2/1989 | Russell | G01R 31/318505 714/734 |
| 5,578,930 A | 11/1996 | Sheen | |
| 5,604,751 A | 2/1997 | Panis | |
| 5,699,402 A | 12/1997 | Bauer et al. | |
| 5,828,674 A | 10/1998 | Proskauer | |
| 5,870,451 A | 2/1999 | Winkler et al. | |
| 5,910,895 A | 6/1999 | Proskauer et al. | |
| 5,938,781 A | 8/1999 | Proskauer | |
| 6,047,293 A | 4/2000 | Blitz | |
| 6,507,920 B1 | 1/2003 | Truebenbach | |
| 6,717,432 B2 | 4/2004 | Chiu et al. | |
| 7,046,027 B2 | 5/2006 | Conner | |
| 7,080,304 B2 | 7/2006 | Reese | |
| 7,085,668 B2 | 8/2006 | Johnson | |

(Continued)

OTHER PUBLICATIONS

Anderson, J. L. "Using software tools and metrics to produce better quality test software." Proceedings AUTOTESTCON 2004.. IEEE, 2004. (Year: 2004).*

(Continued)

*Primary Examiner* — Matthew J Brophy
(74) *Attorney, Agent, or Firm* — Burns & Levinson LLP (57) ABSTRACT

An example includes the following operations: identifying parameters associated with a test program, where the parameters are based on at least one of a device under test (DUT) to be tested by the test program or a type of test to be performed on the DUT by the test program; assigning weights to the parameters; generating a numerical value for the test program based on the parameters, the weights, and equations that are based on the parameters and the weights, where the numerical value is indicative of a complexity of the test program; and using the numerical value to obtain information about effort needed to develop future test programs.

36 Claims, 8 Drawing Sheets

(56) References Cited

U.S. PATENT DOCUMENTS

| | | |
|---|---|---|
| 7,171,587 B2 | 1/2007 | Hlotyak et al. |
| 7,343,387 B2 | 3/2008 | Reese |
| 7,908,531 B2 | 3/2011 | Fairbanks et al. |
| 7,983,871 B2 * | 7/2011 | Kimbrough ........ G01R 31/2894 702/182 |
| 8,131,387 B2 | 3/2012 | Zhang |
| 8,347,271 B1 * | 1/2013 | Nallasivam ......... G06F 11/3684 717/135 |
| 8,375,364 B2 * | 2/2013 | Udupa ................ G06F 11/3696 717/124 |
| 8,762,095 B2 | 6/2014 | Van Wagenen et al. |
| 9,134,377 B2 | 9/2015 | Champion et al. |
| 9,165,735 B2 | 10/2015 | Sanders, III et al. |
| 9,244,126 B2 | 1/2016 | Sartschev et al. |
| 9,279,857 B2 | 3/2016 | Lin et al. |
| 9,335,347 B2 * | 5/2016 | Andberg ............ G01R 31/2893 |
| 9,470,759 B2 | 10/2016 | Bourassa et al. |
| 9,514,037 B1 | 12/2016 | Dow et al. |
| 9,638,742 B2 | 5/2017 | Suto |
| 9,755,766 B2 | 9/2017 | Wadell et al. |
| 9,811,070 B2 * | 11/2017 | Monczynski ......... G05B 15/02 |
| 9,811,451 B1 * | 11/2017 | Arguelles ........... G06F 11/3688 |
| 10,048,304 B2 * | 8/2018 | King ...................... G01R 31/01 |
| 10,139,449 B2 | 11/2018 | Caradonna et al. |
| 10,698,805 B1 * | 6/2020 | Ovadia ............... G06F 11/3688 |
| 10,748,636 B2 * | 8/2020 | Lai ......................... G11C 29/54 |
| 11,068,827 B1 * | 7/2021 | Groce, III ............... G06F 11/36 |
| 2005/0097515 A1 * | 5/2005 | Ribling .............. G06F 11/3672 717/124 |
| 2006/0100844 A1 * | 5/2006 | Yang ................ G01R 31/31718 703/21 |
| 2006/0247879 A1 * | 11/2006 | Hlotyak .............. G01R 31/319 702/108 |
| 2008/0092120 A1 * | 4/2008 | Udupa ............... G06F 11/3696 717/124 |
| 2009/0058449 A1 * | 3/2009 | Kimbrough ........ G01R 31/2894 324/750.14 |
| 2009/0144698 A1 * | 6/2009 | Fanning .............. G06F 11/3676 717/120 |
| 2009/0177447 A1 * | 7/2009 | Hsu ..................... G06F 11/3616 703/2 |
| 2010/0082264 A1 | 4/2010 | Barron et al. |
| 2010/0223035 A1 * | 9/2010 | Weyh ................. G01R 31/2846 703/2 |
| 2012/0017195 A1 * | 1/2012 | Kaulgud ............ G06F 11/3692 717/101 |
| 2012/0260233 A1 * | 10/2012 | Bandyopadhyay ....... G06F 8/36 717/107 |
| 2013/0102091 A1 * | 4/2013 | King ..................... G01R 31/01 324/750.24 |
| 2014/0070828 A1 * | 3/2014 | Andberg ............... G01R 1/073 324/750.25 |
| 2015/0067648 A1 * | 3/2015 | Sivanesan .......... G06F 11/3684 717/124 |
| 2016/0132425 A1 * | 5/2016 | Bassin ............... G06F 11/3684 717/101 |
| 2016/0154728 A1 * | 6/2016 | Bassin .............. G06Q 30/0249 717/124 |
| 2016/0210226 A1 * | 7/2016 | Hall ................... G06F 11/3692 |
| 2017/0139817 A1 * | 5/2017 | Bassin ............... G06Q 30/0249 |
| 2017/0228306 A1 * | 8/2017 | Edwards ............ G06F 11/2247 |
| 2018/0210709 A1 * | 7/2018 | Bharthulwar .......... G06F 8/24 |
| 2018/0260314 A1 * | 9/2018 | Singi ................... G06F 11/3684 |
| 2018/0349135 A1 * | 12/2018 | Burns ...................... G06F 8/70 |
| 2019/0171446 A1 * | 6/2019 | Bryan .................. G06Q 10/06 |
| 2019/0370158 A1 * | 12/2019 | Rivoir ................ G06F 11/3672 |
| 2019/0377670 A1 * | 12/2019 | Rivoir ................ G01R 31/287 |
| 2020/0225944 A1 * | 7/2020 | Wright ..................... G06F 8/71 |
| 2020/0225945 A1 * | 7/2020 | Wright ..................... G06N 3/084 |

OTHER PUBLICATIONS

Araiza, Michael L. "A formal framework for predictive maintenance." Proceedings AUTOTESTCON 2004.. IEEE, 2004. (Year: 2004).*

Javier Ferrer, et al. "Estimating Software Testing Complexity". Departamento de Lenguajes y Ciencias de la Computacion Universidad de Malaga, Spain. (Aug. 29, 2013), (26 pages).

* cited by examiner

|   | O | P | Q | R | S | T | U | V | W | X | Y |
|---|---|---|---|---|---|---|---|---|---|---|---|
| 1 | Embedded in Formula | 0.80 | 1 | 0.65 | 1.50 | 1.25 | 1.00 | 1.33 | 3.00 | 1.03 | 1.75 |
| 2 | Derivative reuse (%) | %Hardware Reuse | Test Program Origin | Bin 1 Only | Device Known Good | Concurrent Test | Site Count | Total Relays | # Specialized Circuit Blocks | # Test Insertions | # Site Serial Loops |
| 3 | 0.2 | 0.8 | Conversion Non-Teradyne | Yes | Yes | Yes | 4 | 20 | 0 | 1 | 63 |
| 4 | 0.2 | 0 | Conversion Teradyne Same SW Platf | Yes | No | No | 1 | 63 | 0 | 2 | 25 |
| 5 | 0.3 | 0 | New Test Program | No | No | No | 8 | 128 | 0 | 1 | 79 |
| 6 | 0 | 0 | New Test Program | No | Yes | No | 1 | 0 | 0 | 1 | 0 |
| 7 | 0.8 | 0 | Conversion Teradyne Same SW Platf | No | Yes | No | 4 | 224 | 0 | 1 | 144 |
| 8 | 0.8 | 0 | Conversion Teradyne Same SW Platf | No | Yes | No | 4 | 220 | 0 | 1 | 216 |
| 9 | 0.8 | 0.1 | Conversion Teradyne Same SW Platf | No | Yes | Yes | 16 | 192 | 0 | 1 | 115 |
| 10 | 0 | 0.1 | Conversion Teradyne Same SW Platf | No | Yes | No | 12 | 240 | 0 | 2 | 74 |
| 11 | 0 | 0 | Conversion Non-Teradyne | No | Yes | No | 4 | 176 | 12 | 1 | 68 |
| 12 | 0.1 | 0 | New Test Program | Yes | Yes | No | 2 | 7 | 2 | 7 | 0 |
| 13 | 0.1 | 0.7 | Conversion Teradyne Diff. SW platfd | No | Yes | No | 8 | 96 | 6 | 1 | 57 |

| | Z | AA | AB | AC | AD | AE | AF | AG | AH | AI | AJ | AK | AL |
|---|---|---|---|---|---|---|---|---|---|---|---|---|---|
| 1 | 3.00 | 2.00 | 2.00 | 1.50 | 1.25 | 1.25 | 1.25 | 1.75 | 1.00 | 2.00 | 1.25 | 1.75 | 1.25 |
| 2 | Total Unique ATPG Patterns | Total Hand Created Patterns | Unique Time Sets | Total Flash Results | # Standard Protocols | # Custom Protocols | Digital Tests >2Gb | # Time Measurements | # AC Test Results | # Modulated Results <=6Ghz | # CW Results <=6Ghz | # Modulated Results > 6Ghz | # CW Results >6Ghz |
| 3 | 5423 | 8 | 8 | 10 | 1 | 0 | 0 | 0 | 0 | 0 | 0 | 0 | 0 |
| 4 | 15 | 1 | 16 | 0 | 0 | 1 | 0 | 0 | 0 | 0 | 0 | 8 | 1059 |
| 5 | 33 | 5 | 28 | 0 | 1 | 1 | 0 | 8 | 12 | 15 | 75 | 0 | 0 |
| 6 | 0 | 30 | 5 | 0 | 1 | 0 | 0 | 8 | 41 | 0 | 0 | 28 | 580 |
| 7 | 3 | 0 | 20 | 0 | 3 | 1 | 0 | 48 | 67 | 0 | 0 | 0 | 0 |
| 8 | 12 | 0 | 8 | 0 | 1 | 1 | 0 | 13 | 162 | 0 | 0 | 0 | 0 |
| 9 | 1252 | 0 | 20 | 500 | 0 | 1 | 0 | 60 | 0 | 0 | 0 | 0 | 0 |
| 10 | 435 | 0 | 29 | 400 | 0 | 1 | 0 | 29 | 36 | 0 | 0 | 0 | 0 |
| 11 | 0 | 166 | 140 | 0 | 1 | 0 | 0 | 15 | 0 | 0 | 0 | 0 | 0 |
| 12 | 25 | 0 | 7 | 0 | 2 | 0 | 0 | 1 | 4 | 0 | 0 | 39 | 163 |
| 13 | 46 | 2 | 20 | 0 | 1 | 1 | 0 | 14 | 0 | 0 | 0 | 0 | 0 |

FIG. 3

| | AM | AN | AO | AP | AQ | AR | AS | AT |
|---|---|---|---|---|---|---|---|---|
| 1 | 1.75 | 1.00 | 1.00 | 1.25 | 2.00 | 2.50 | 1.20 | |
| 2 | # RF Trim Tests | # DC Parametric | # DC Continuous Power | DC Cont >800A | # DC Dynamic Power | DC Dynamic >2500A | # DC Trim Tests | Total Digital Tests |
| 3 | 0 | 95 | 30 | 0 | 0 | 0 | 0 | 592 |
| 4 | 1 | 170 | 0 | 0 | 0 | 0 | 0 | 37 |
| 5 | 19 | 68 | 0 | 0 | 1 | 0 | 46 | 67 |
| 6 | 0 | 0 | 0 | 0 | 0 | 0 | 0 | 18 |
| 7 | 0 | 220 | 30 | 0 | 0 | 0 | 0 | 46 |
| 8 | 0 | 664 | 30 | 0 | 0 | 0 | 0 | 22 |
| 9 | 0 | 2041 | 0 | 0 | 50 | 0 | 50 | 943 |
| 10 | 0 | 1053 | 0 | 0 | 50 | 0 | 40 | 720 |
| 11 | 0 | 168 | 0 | 0 | 0 | 0 | 0 | 309 |
| 12 | 2 | 0 | 266 | 0 | 0 | 0 | 0 | 22 |
| 13 | 0 | 146 | 0 | 0 | 0 | 0 | 0 | 51 |

FIG. 4

| | AU | AV | AW | AX | AY | AZ | BA | BB | BC | BD |
|---|---|---|---|---|---|---|---|---|---|---|
| | Total Analog Tests | Total DC Tests | Total Tests | %Derivative, Conversion, Library | DIB Complexity | Serial Site 1 Total | w/Site Loop | w/Site Count | w/Concurrent | w/Insertions |
| 3 | 0 | 125 | 717 | 689 | 10 | 698 | 808 | 886 | 1,107 | 1,107 |
| 4 | 1340 | 170 | 1,547 | 1,423 | 84 | 1,507 | 1,551 | 1,551 | 1,551 | 1,589 |
| 5 | 183 | 125 | 375 | 324 | 170 | 494 | 633 | 731 | 731 | 731 |
| 6 | 829 | 0 | 847 | 847 | 0 | 847 | 847 | 847 | 847 | 847 |
| 7 | 151 | 250 | 447 | 304 | 298 | 602 | 854 | 936 | 936 | 936 |
| 8 | 185 | 694 | 901 | 612 | 293 | 905 | 1,283 | 1,406 | 1,406 | 1,406 |
| 9 | 105 | 2201 | 3,249 | 2,210 | 235 | 2,444 | 2,646 | 3,234 | 4,042 | 4,042 |
| 10 | 87 | 1201 | 2,008 | 2,008 | 294 | 2,301 | 2,431 | 2,900 | 2,900 | 2,973 |
| 11 | 26 | 168 | 503 | 503 | 270 | 774 | 893 | 978 | 978 | 978 |
| 12 | 281 | 266 | 570 | 544 | 15 | 559 | 559 | 584 | 584 | 672 |
| 13 | 25 | 146 | 221 | 215 | 64 | 279 | 379 | 437 | 437 | 437 |

FIG. 5

|   | BE | BF | BG | BH | BI | BJ | BK |
|---|---|---|---|---|---|---|---|
|   | w/First/ known Silicon | w/Bin 1 vs RTP | Calculated SCU | Calculated SCU/Ey | Eng Years | Region | Sub-region |
| 3 | 1,107 | 720 | 720 | 189 | 3.8 | SEG US | SEG US Central |
| 4 | 2,384 | 1,550 | 1,550 | 783 | 1.98 | SEG Korea | SEG Korea SR |
| 5 | 1,096 | 1,096 | 1,096 | 1,543 | 0.71 | SEG China | SEG China SR |
| 6 | 847 | 847 | 847 | 1,412 | 0.6 | SEG US | SEG US South |
| 7 | 936 | 936 | 936 | 1,185 | 0.79 | SEG Europe | SEG Europe Sout |
| 8 | 1,406 | 1,406 | 1,406 | 1,780 | 0.79 | SEG Europe | SEG Europe Sout |
| 9 | 4,042 | 4,042 | 4,042 | 892 | 4.53 | SEG Europe | SEG Europe Sout |
| 10 | 2,973 | 2,973 | 2,973 | 1,370 | 2.17 | SEG Europe | SEG Europe Sout |
| 11 | 978 | 978 | 978 | 365 | 2.68 | SEG US | SEG US NW |
| 12 | 672 | 437 | 437 | 682 | 0.64 | SEG Korea | SEG Korea SR |
| 13 | 437 | 437 | 437 | 394 | 1.11 | SEG US | SEG US Central |

DETERMINING THE COMPLEXITY OF A TEST PROGRAM

TECHNICAL FIELD

This specification relates generally to example processes for determining the complexity of a test program.

BACKGROUND

Automatic test equipment (ATE) includes test instruments for sending signals to, and receiving signals from, a device under test (DUT) in order to test operation of the DUT. Examples of test instruments include, but are not limited to, radio frequency (RF) test instruments and microwave test instruments. A test instrument may be configured to execute a test program to generate the signals sent the DUT and to analyze the signals received from the DUT. The test program may be written in source code by a test engineer. This source code may be compiled and provided to a test instrument for execution.

SUMMARY

An example method is performed by one or more processing devices. The method includes the following operations: identifying parameters associated with a test program, where the parameters are based on at least one of a device under test (DUT) to be tested by the test program or a type of test to be performed on the DUT by the test program; assigning weights to the parameters; generating a numerical value for the test program based on the parameters, the weights, and equations that are based on the parameters and the weights, where the numerical value is indicative of a complexity of the test program; and using the numerical value to obtain information about effort needed to develop future test programs. The operations may be implemented using instructions that are stored on one or more non-transitory storage devices and that are executable by one or more processing devices. One of more of the following features may also be included, either alone or in combination.

Obtaining the information may include generating a graph that plots the numerical value against a time period for a tool or the entity to develop the test program. The graph may include multiple numerical values for test programs plotted against corresponding times to develop the test programs. It may be determined whether the numerical value is an outlier on a trend that is based on the multiple numerical values. Obtaining the information may include dividing the numerical value by an amount of time taken to develop the test program to produce a numerical value per unit time.

The operations may include using the numerical value to obtain information about a tool used to develop the test program. In this example, obtaining the information may include generating a graph that plots the numerical value against a time period to develop the test program. The graph may include multiple numerical values for test programs plotted against corresponding times to develop the test programs. The operations may include determining whether the numerical value changes relative to a different numerical value for a different tool used to develop the test program. The operations may include generating a graph that plots multiple numerical values for test programs plotted against corresponding times to develop the test programs. In this example, obtaining the information includes using the graph to predict an amount of effort by the entity tasked to develop the test program.

The test parameters may relate to operation of the test program on a test system. The test parameters may relate to a test system on which the test program is operated. Generating the numerical value indicative of the complexity of the test program may include executing processes based on digital testing, analog testing, and direct current (DC) testing. Generating the numerical value may include performing an operation that is based on a complexity of a device interface board included on a test system configured to execute the test program. Generating the numerical value may include performing an operation that is based on serial site loops employed as part of a testing process implemented by the test program. Generating the numerical value may include performing an operation that is based on insertions employed as part of a testing process implemented by the test program. Generating the numerical value may include performing an operation that is based on whether one or more devices under test are known-good. Generating the numerical value may include performing an operation that is based on whether one or more devices under test are released to production.

At least one of the parameters associated with the test program may have a linear impact on the numerical value. At least one of the parameters may have a non-linear impact on the numerical value. The operations may also include using the numerical value to obtain information about at least one of a tool used to develop the test program or an entity tasked to develop the test program. The entity may be an engineer. The DUT may be or include at least one of a digital device, a radio frequency wireless device, a mixed signal device, or a power device.

Any two or more of the features described in this specification, including in this summary section, can be combined to form implementations not specifically described herein.

The systems and techniques described herein, or portions thereof, can be implemented using, or controlled by, a computer program product that includes instructions that are stored on one or more non-transitory machine-readable storage media, and that are executable on one or more processing devices to implement the operations described herein. The systems and techniques described herein, or portions thereof, can be implemented as an apparatus, method, or electronic system that can include one or more processing devices and memory to store executable instructions to implement various operations.

The details of one or more implementations are set forth in the accompanying drawings and the description below. Other features, objects, and advantages will be apparent from the description and drawings, and from the claims.

DETAILED DESCRIPTION

Described herein are example processes for determining the complexity of a test program. The processes may include generating a numerical value indicative of a complexity of the test program and using that numerical value to obtain information about an amount of effort needed to develop future test programs.

In this regard, an example test system, such as automatic test equipment (ATE), includes test instruments that are configured to output test signals to a device under test (DUT) and to receive signals from the DUT. The signals received may be responsive to the test signals or independent thereof. A test instrument may be configured to execute a test program to generate the signals sent to the DUT and to analyze the received. The test program may be written in source code by a test engineer. This source code may be compiled and provided to a test instrument for execution.

A test engineer may develop the test program using one or more tools. For example, a test engineer may use computer programs to develop the test program. Different test programs have different levels of complexity and, therefore, may require a different amount of effort to develop. Engineering time is one metric used to measure the amount of effort. For example, engineering time may be measured in the number of years a test engineer having an ordinary skill level would take to complete a task.

The levels of complexity of a test program may be based on various parameters that may be based, for example, on a DUT to be tested by a test program, types of tests to be performed on by the test program, and attributes of ATE or test instrument hardware. For example, the level of complexity of the test program may be based on the number of DUT test sites on the ATE, the number of serial site test loop operations that need to be performed, and the number of insertions that need to be performed. Other parameters that may affect the complexity of the test program are described herein. These parameters may be processed using empirically-derived equations to generate a numerical value indicative of a complexity of the test program. The numerical values for different test programs may be plotted against engineering time needed to implement those test programs. The resulting graph may be referenced during future development efforts. For example, a test engineer may identify, on the graph, a test program that has parameters similar to a new (future) test program to be developed. The graph may be used to predict the approximate amount of effort in engineering hours that will be required to develop the new test program.

Example operations that may be executed by a computing system to implement the foregoing process include identifying parameters associated with a test program. The parameters may be based on at least one of a DUT to be tested by the test program or a type of test to be performed on the DUT by the test program. The operations may also include assigning weights to the parameters. The weights may be used to emphasize or to deemphasize the importance of one, some, or all of the parameters. For example, values of the parameters may be multiplied by their respective weights. The operations may include generating a numerical value for the test program based on the parameters, the weights, and equations that are based on the parameters and the weights. As explained, the numerical value is indicative of the complexity of the test program. The numerical value may be used to obtain information about the amount of effort needed to develop future test programs.

Figure 1:
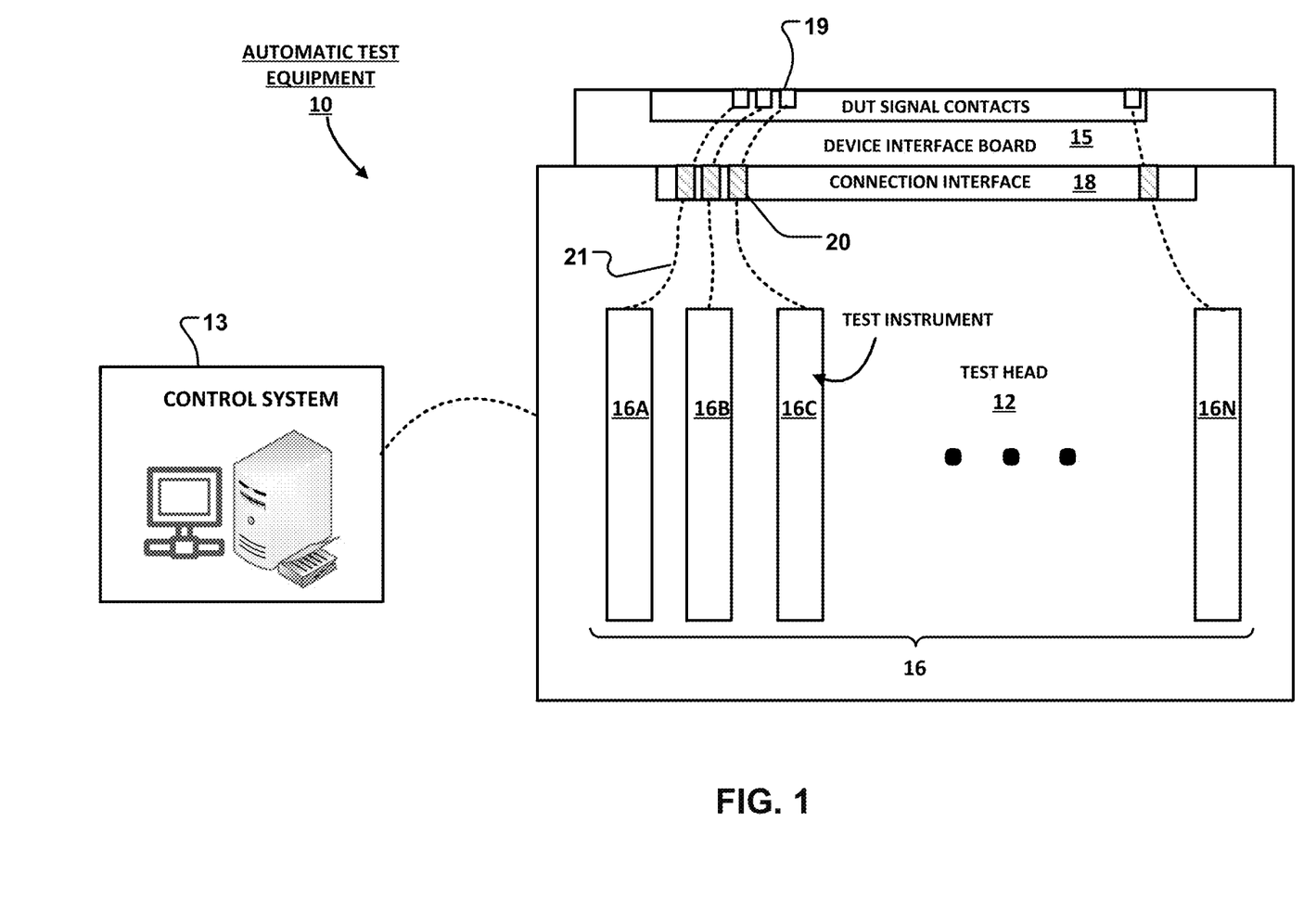
FIG. 1 is block diagram side view of components of an example test system.

FIG. 1 shows components of example ATE 10 that may be used to execute test programs of the type described herein. In FIG. 1, the dashed lines represent, conceptually, potential signal paths between components of the system.

ATE 10 includes a test head 12 and a control system 13. The control system may include a computing system comprised of one or more microprocessors or other appropriate processing devices as described herein. Device interface board (DIB) 15 includes a printed circuit board (PCB) that is connected to test head 12 and that includes mechanical and electrical interfaces to one or more DUTs (not shown) that are being tested or are to be tested by the ATE. Power, including voltage, may be run via one or more conduits in the DIB to DUTs connected to the DIB. Examples of DUTs that may be tested include digital devices, RF wireless devices, mixed signal devices, or power devices. The ATE may test combinations of two or more of these types of DUTS.

In the example of FIG. 1, DIB 15 connects, electrically and mechanically, to test head 12. The DIB includes test sites 19, which may include pins, ball grid array pads, or other points of electrical and mechanical connection to which the DUTs may connect. Test signals and response signals such as RF signals and other signals pass via test channels over the sites between the DUTs and test instruments. DIB 15 may include, among other things, connectors, conductive traces and circuitry for routing signals between the test instruments, DUTs connected to sites 19, and other circuitry. DIBs may also include relays to configure signal transmission paths. An example relay includes an electrically operated switch that may closed using low current values.

Control system 13 communicates with components included in the test head to control testing. For example, control system 13 may download test programs to test instruments 16A to 16N in the test head. The test instruments include hardware devices and may include one or more processing devices and other circuitry. Test instruments 16A to 16N may run the test programs to test DUTs in communication with the test instruments. Control system 13 may also send, to test instruments in the test head, instructions, test data, and/or other information that are usable by the test instruments to perform appropriate tests on DUTs interfaced to the DIB. In some implementations, this information may be sent via a computer or other type of network or via a direct electrical path. In some implementations, this information may be sent via a local area network (LAN) or a wide area network (WAN).

The test programs may be written in source code by a test engineer as described herein. In some implementations, the source code may be compiled by the control system to generate object code that is downloaded to the test instruments for execution. In some implementations, the source code may be downloaded to the test instruments. The test instruments may compile the source code locally and then execute the resulting object code. In an example, a test program is executed to generate a test flow to provide to the DUT. The test flow may include output test signals to elicit a response from the DUT, for example. The test program also may be configured to receive responses from the DUT, to analyze those responses, and to determine if the DUT passed testing based on analysis of the responses.

In the example of FIG. 1, ATE 10 includes multiple test instruments 16A to 16N, each of which may be configured, as appropriate, to perform one or more testing and/or other functions. Although only four test instruments are depicted, the system may include any appropriate number of test instruments, including those residing outside of test head 12. In some implementations, each test instrument may be configured to output analog, digital, or RF signals to test a DUT based, e.g., on data provided by the control system, and to receive analog, digital, or RF response signals from the DUT. Different test instruments may be configured to execute different types of test programs and/or be programmed to test different DUTs. For example, the test instruments may include an RF test instrument 16B to send RF test signals to a DUT and to receive RF response signals from the DUT. The received signals may include RF response signals that are based on the test signals and/or signals that originate from the DUT that are not prompted by (e.g., are not in response to) test signals. In some implementations, there may be electrical conductors, such as coaxial wires, between the DUT, the DIB, and the test instrument interfaces over which test and response signals are sent.

Test signals, including RF signals, may be sent to, and received from, the DUT over multiple test channels or other electrically conductive media. In some examples, a test channel may include the physical transmission medium or media over which signals are sent from the test instrument to a DUT and over which signals are received from the DUT. Physical transmission media may include, but are not limited to, electrical conductors alone or in combination with wireless transmission media. In some examples, a test channel may include a range of frequencies over which signals are transmitted over one or more physical transmission media. A test channel may include and/or electrically connect to a conductive trace on the DIB. A test channel may also include hardware on the test instrument for receiving and digitizing signals.

In some examples, ATE 10 includes a connection interface 18 that connects test instrument test channels 21 to DIB 15. Connection interface 18 may include connectors 20 or other devices for routing signals between the test instruments and DIB 15. For example, the connection interface may include one or more circuit boards or other substrates on which such connectors are mounted. Conductors that are included in the test channels may be routed through the connection interface and the DIB.

Parameters associated with the ATE, the DIB, the DUT, and the test program itself may affect a complexity of the test program. Examples of parameters that may have an impact on the complexity of a test program are shown in Table 30, which is spread across FIGS. 2 to 6. Weights, if any, that correspond to each of these parameters are shown in row "1" 31 (not included in FIGS. 5 and 6). Rows 32 contain parameter values and calculated values (described below) for different test programs. Some of the parameters may have a linear impact on the complexity and some of the parameters may have a nonlinear impact on the complexity. For example, generating and debugging a first digital test pattern in a sequence of patterns may take considerably more effort than debugging subsequent digital test patterns in the same sequence. The weights and equations explained below account for these impacts.

Parameters that may affect a complexity of the test program may include, but are not limited to, the following types of parameters.

Figure 2:
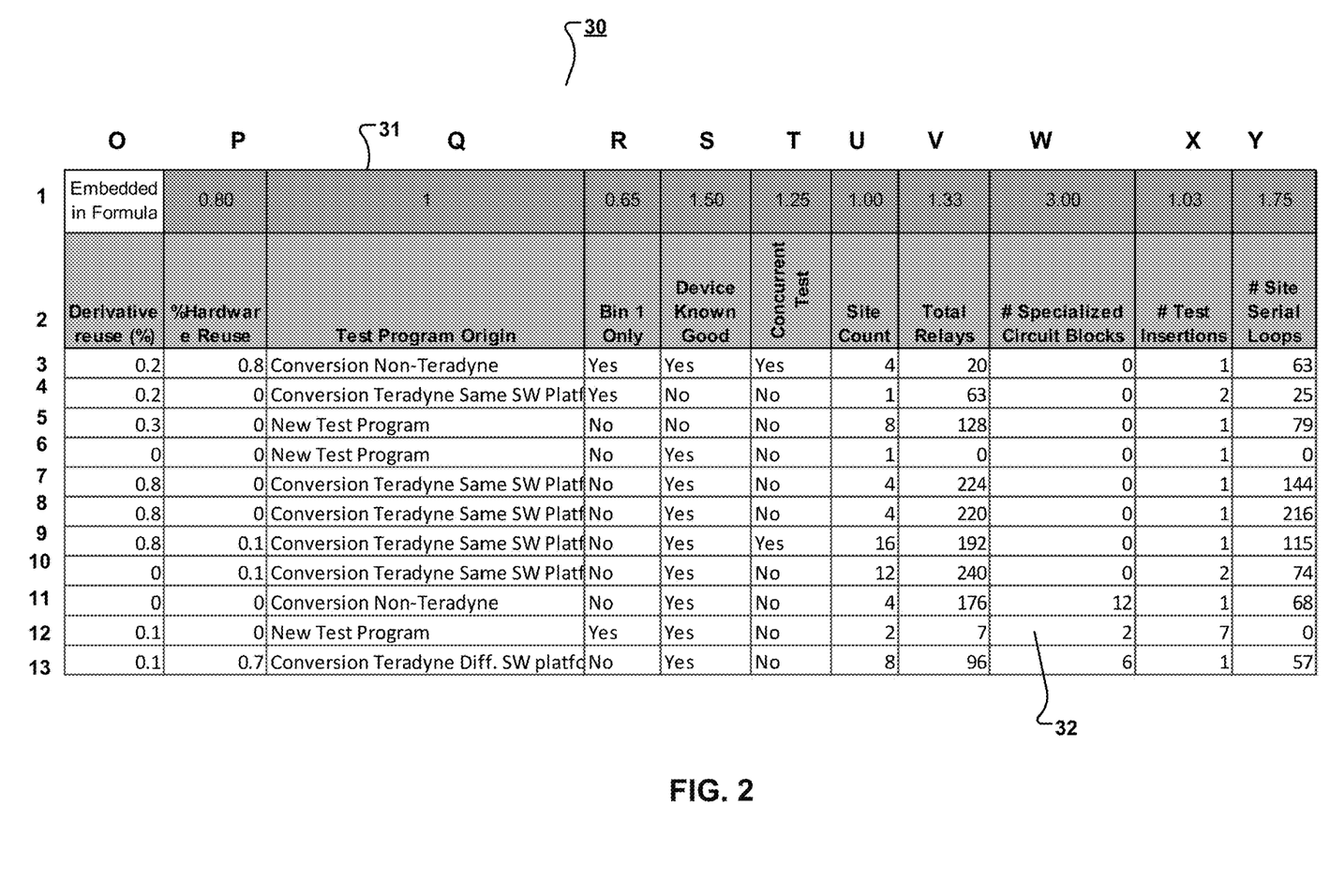
FIGS. 2 to 6 each shows a portion of a spreadsheet or table containing information that is usable to determine the complexity of a test program.

Derivative Reuse %: This parameter identifies, in terms of percentage, the amount of a test program that can be reused in another test program. In table 30, this parameter is shown in column 0.

Hardware Reuse %: This parameter identifies, in terms of percentage, the amount of the DIB, the ATE, or other hardware that can be reused for different tests. This parameter has a weight factor of 0.8 in this example. In table 30, this parameter is shown in column P.

Test Program Origin: This parameter characterizes components of a test system based on the company that created the test program or test system and whether the test program or test system is a new version, a derivative version, or a conversion of a different test program or test system. This parameter has a weight factor of 1.00 in this example. In table 30, this parameter is shown in column Q.

Bin 1 Only: This parameter categorizes a functional test program as being correlated to known test results or not. This parameter has values of either "yes" or "no". "Yes" indicates that the test program is fully correlated and "no" indicates that the test program is only functional and not correlated. This parameter has a weight factor of 0.65 in this example. This parameter contrasts with "Release to Production" (RTP), which means that the test program is being released for production and therefore must meet more stringent operational tolerances than a test program that is characterized as fully functional (that is, "yes" for "Bin 1"). In table 30, this parameter is shown in column R.

Device Known Good: This parameter categorizes a DUT as having a known or unknown operational status. This parameter has values of either "yes" or "no". "Yes" indicates that the DUT is known operational as it has had some level of previous testing and has passed those tests. "No" indicates that the DUT has not been previously tested or has not passed testing. This parameter has a weight factor of 1.5 in this example. In table 30, this parameter is shown in column S.

Concurrent Test: This parameter categorizes a test program as being capable of concurrent testing. This parameter has values of either "yes" or "no". "Yes" indicates that the test program is capable of performing two different tests on the same DUT at the same time. "No" indicates that the test program is not capable of performing two different tests on the same DUT at the same time. This parameter has a weight factor of 1.25 in this example. In table 30, this parameter is shown in column T.

Site Count: This parameter identifies the number of test sites on a DIB. This parameter has an integer value. This parameter has a weight factor of 1.00 in this example. In table 30, this parameter is shown in column U.

Total Relays: This parameter identifies the number of relays that need to be controlled on a DIB or other hardware to implement a signal transmission path for testing. This parameter has an integer value. This parameter has a weight factor of 1.33 in this example. In table 30, this parameter is shown in column V.

Number (#) of Specialized Circuit Blocks: This parameter identifies the number of specialized circuit blocks included on the DIB or elsewhere that must be accounted for—for example, configured—during testing. A specialized circuit block may include circuitry on the DIB that requires configuration to implement a signal transmission path for testing. This parameter has an integer value. This parameter has a weight factor of 3.00 in this example. In table 30, this parameter is shown in column W.

Number (#) of Test Insertions: This parameter identifies the number of test insertions that are to be performed during testing. An example test insertion includes a test performed at a target temperature. Each test insertion, therefore, includes the same test performed at a different target temperature. This parameter has an integer value. This parameter has a weight factor of 1.03 in this example. In table 30, this parameter is shown in column X.

Number (#) of Site Serial Loops: This parameter identifies the number of serial site loops performed during testing. An example serial site loop includes the number of test sites on which a piece of code is to be executed serially (as opposed to in parallel). This parameter has an integer value. This parameter has a weight factor of 1.75 in this example. In table 30, this parameter is shown in column Y.

Figure 3:
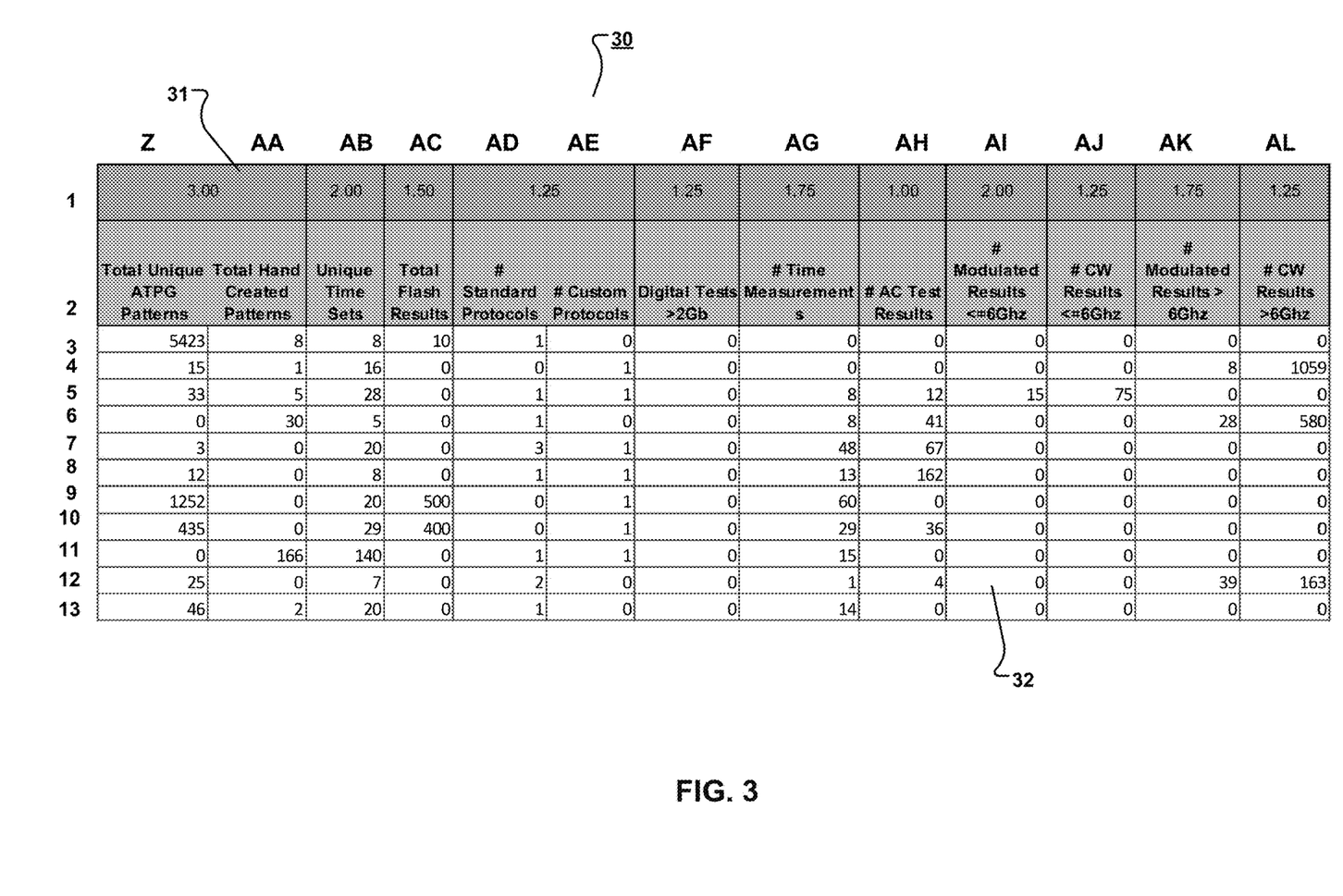

Total Unique ATPG (Automatic Test Pattern Generated) Patterns: This parameter identifies the number of unique or different automatically generated test patterns used by the test program during testing. This parameter has an integer value. This parameter has a weight factor of 3.00 in this example. In table 30, this parameter is shown in column Z.

Total Hand Created Patterns: This parameter identifies the number of user-coded (as opposed to automatically-generated) test patterns used by the test program during testing. This parameter has an integer value. This parameter has a weight factor of 3.00 in this example. In table 30, this parameter is shown in column AA.

Unique Time Sets: This parameter is the number unique digital edge timing relationships that the digital tester channels are programmed for when using all the different digital test patterns. This parameter has a weight factor of 2.00 in this example. In table 30, this parameter is shown in column AB.

Total Flash Result: This parameter is the number of data logged test results produced by the test program when testing an embedded flash memory in the DUT. This parameter has a weight factor of 1.50 in this example. In table 30, this parameter is shown in column AC.

Number (#) of Standard Protocols: This parameter identifies the number of industry-known communication protocols used by the test program for instrumentation and data acquisition, for example. This parameter has an integer value. This parameter has a weight factor of 1.25 in this example. In table 30, this parameter is shown in column AD.

Number (#) of Custom Protocols: This parameter identifies the number of custom-designed or unique communication protocols used by the test program for instrumentation and data acquisition, for example. This parameter has an integer value. This parameter has a weight factor of 1.25 in this example. In table 30, this parameter is shown in column AE.

Number (#) of Digital Tests>2 Gb: This parameter identifies the number of digital tests performed by the test program on the DUT that exceed 2 Gigabits per second (Gbps) of data transfer to and from the DUT. This parameter has an integer value. This parameter has a weight factor of 1.25 in this example. In table 30, this parameter is shown in column AF.

Number (#) of Time Measurements: This parameter identifies the number of timing measurements including rise and fall time and frequency measurements to be made on the DUT by the test program. This parameter has an integer value. This parameter has a weight factor of 1.75 in this example. In table 30, this parameter is shown in column AG.

Number (#) of AC (Alternating Current) Test Results: This parameter identifies the number of AC tests to be performed by the test program on the DUT. This parameter has an integer value. This parameter has a weight factor of 1.00 in this example. In table 30, this parameter is shown in column AH.

Number (#) of Modulated Results ("<=") 6 GHz: This parameter identifies the number of modulated waveforms that are less than or equal to 6 Gigahertz (GHz) that are sourced and captured by the test program. An example modulated wave includes an electromagnetic wave having a carrier frequency wave modulated amplitude, frequency, and phase. This parameter has an integer value. This parameter has a weight factor of 2.00 in this example. In table 30, this parameter is shown in column AI.

Number (#) of CW Results 6 GHz: This parameter identifies the number of continuous wave (CW) test results that are less than or equal to 6 GHz and that are sourced and captured by the test program. An example continuous wave includes an electromagnetic wave having constant amplitude and frequency. This parameter has an integer value. This parameter has a weight factor of 1.25 in this example. In table 30, this parameter is shown in column AJ.

Number (#) of Modulated Results>6 GHz: This parameter identifies the number of modulated waveforms that are greater than 6 GHz that are sourced and captured by the test program. This parameter has an integer value. This parameter has a weight factor of 1.75 in this example. In table 30, this parameter is shown in column AK.

Number (#) of CW Results>6 GHz: This parameter identifies the number of continuous wave (CW) test results that are greater than 6 GHz and that are sourced and captured by the test program. This parameter has an integer value. This parameter has a weight factor of 1.25 in this example. In table 30, this parameter is shown in column AL.

Figure 4:
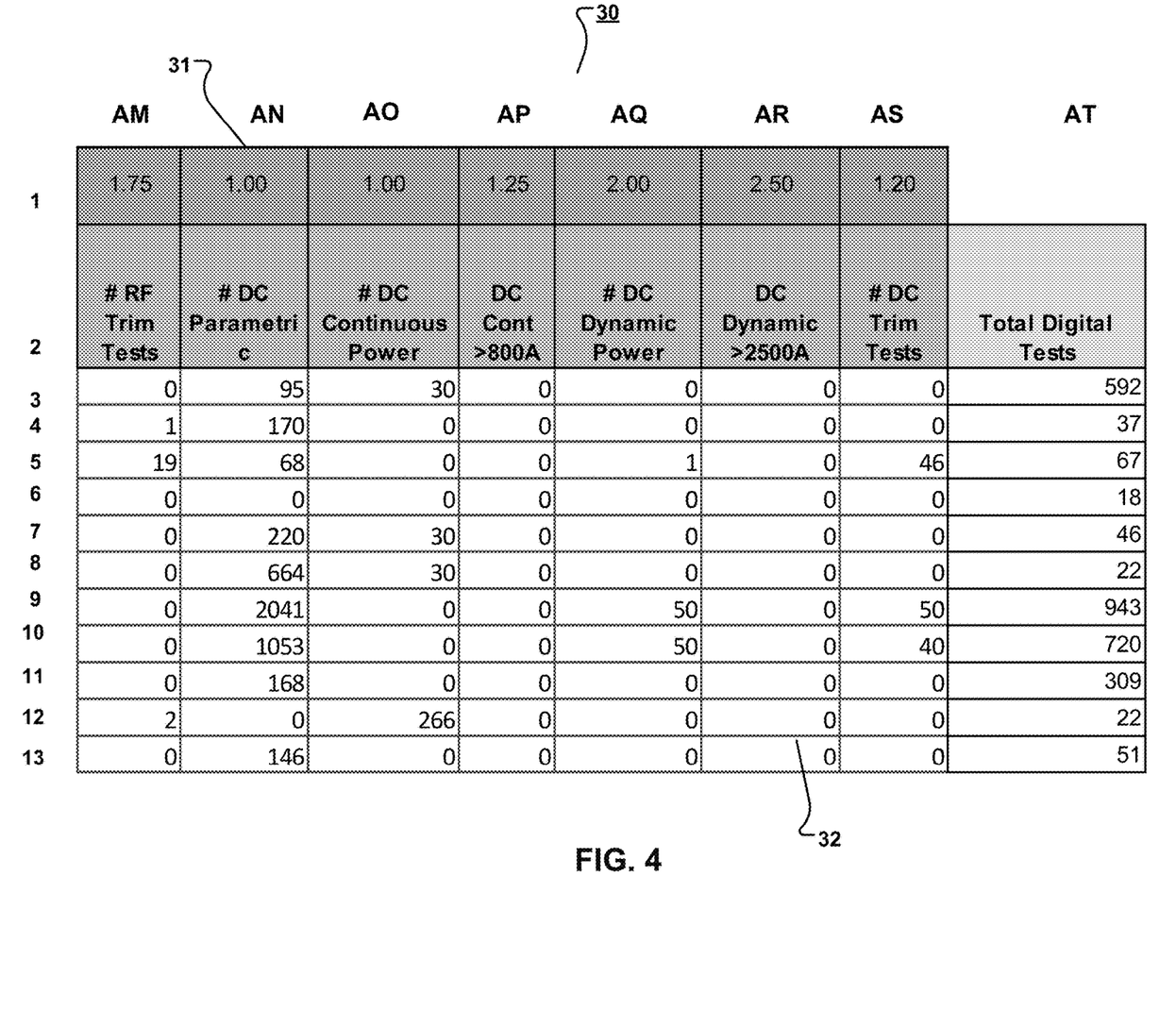

Number (#) of RF Trim Tests. This parameter identifies the number of RF trimming tests performed by the test program on the DUT. An example RF trimming test includes trimming or reducing the bandwidth of an RF signal sent to or received from the DUT. This parameter has an integer value. This parameter has a weight factor of 1.75 in this example. In table 30, this parameter is shown in column AM.

Number (#) of DC Parametric Tests: This parameter identifies the number of direct current (DC) parametric tests performed by the test program on the DUT. Example parametric tests include testing leakage and loading tests. This parameter has an integer value. This parameter has a weight factor of 1.00 in this example. In table 30, this parameter is shown in column AN.

Number (#) of DC Continuous Power<800 A and <1400V Tests: This parameter identifies the number of tests performed by the test program on the DUT using constant DC power at less than 800 Amperes (A) of current and less than 1400V for high power devices. In an example, constant DC power includes DC power that does not change over a predefined time period. Example tests include power supply current tests and power supply rejection tests. This parameter has an integer value. This parameter has a weight factor of 1.00 in this example. In table 30, this parameter is shown in column AO.

Number (#) of DC Continuous Power>=800 A or >=1400V Tests: This parameter identifies the number of tests performed by the test program on the DUT using constant DC power generated using greater than or equal to 800 Amperes (A) of current or greater than or equal to 1400V for high power devices. This parameter has an integer value. This parameter has a weight factor of 1.25 in this example. In table 30, this parameter is shown in column AP.

Number (#) of DC Dynamic Power Tests<2500 A: This parameter identifies the number of tests performed by the test program on the DUT using dynamic DC power generated using less than 2500 Amperes (A) of current. In an example, dynamic DC power includes DC power that changes to preprogrammed values over a predefined time period. This parameter has an integer value. This parameter has a weight factor of 2.00 in this example. In table 30, this parameter is shown in column AQ.

Number (#) of DC Dynamic Power Tests>=2500 A tests: This parameter identifies the number of tests performed by the test program on the DUT using dynamic DC power generated using greater than or equal to 2500 Amperes (A) of current. This parameter has an integer value. This parameter has a weight factor of 2.50 in this example. In table 30, this parameter is shown in column AR.

Number (#) of DC Trim Tests: This parameter identifies the number of tests performed by the test program on the DUT by trimming or adjusting DUT voltages. This parameter has an integer value. This parameter has a weight factor of 1.20 in this example. In table 30, this parameter is shown in column AS.

The complexity value described herein, an example of which is called the "Solution Complexity Unit" (SCU), may be generated by processing any appropriate combination of two or more of the preceding parameters. The processing of the parameters that relate to the test program's attributes is done so by processing both linear and non-linear relationships to appropriately represent complexity.

To process the parameters to obtain a calculated complexity value, intermediary values are obtained. The intermediary values ae based on values of the parameters and weights, if any, assigned to those parameters. The following equations are also expressed in terms of the columns associated with the parameters presented table 30. In this regard, in those equations, "$" means to apply the weight for the corresponding value. So, for example, "Z$1*Z4" means to multiply the weight from row 1, column Z to the value in the cell at Z4, which is column Z, row 4 in this example. The example formulas below all reference row 3, which is the first row containing data, hence the "3" such as in "AA3+AB3".

Total Digital Test Value:
[(Total Unique ATPG Patterns)+(Total Hand Created Patterns)]/(Log$_e$ [(3.00)*[(Total Unique ATPG Patterns)+(Total Hand Created Patterns)]+(2.00)*(Unique Time Sets)+(1.5)*(Total Flash Result)+(1.25)*[(# of Standard Protocols)+(# of Custom Protocols)]+(1.25)*(# of Digital Tests>2 Gb)

In table 30, this value is shown in column AT. The preceding equation expressed in terms of row, column, and/or weight values in Microsoft® Excel® ("Excel®") equation format is as follows:
(Z3+AA3)>0,((Z3+AA3)/LN(Z$1*(Z3+AA3)))+(AB$1*AB3)±(AC$1*AC3)+(AD$1*(AD3+A E3))+(AF$1*AF3)

Total Analog Test Value:
(1.75)*(# of Time Measurements)+(1.00)*(# of AC Test Results)+(2.00)*(# of Modulated Results≤6 GHz)+(1.25)*(# of CW results)+(1.75)*(# of Modulated Results>6 GHz)+(1.25)*(# of CW Results>6 GHz)+(1.75)*(# of Trim Tests)

Figure 5:
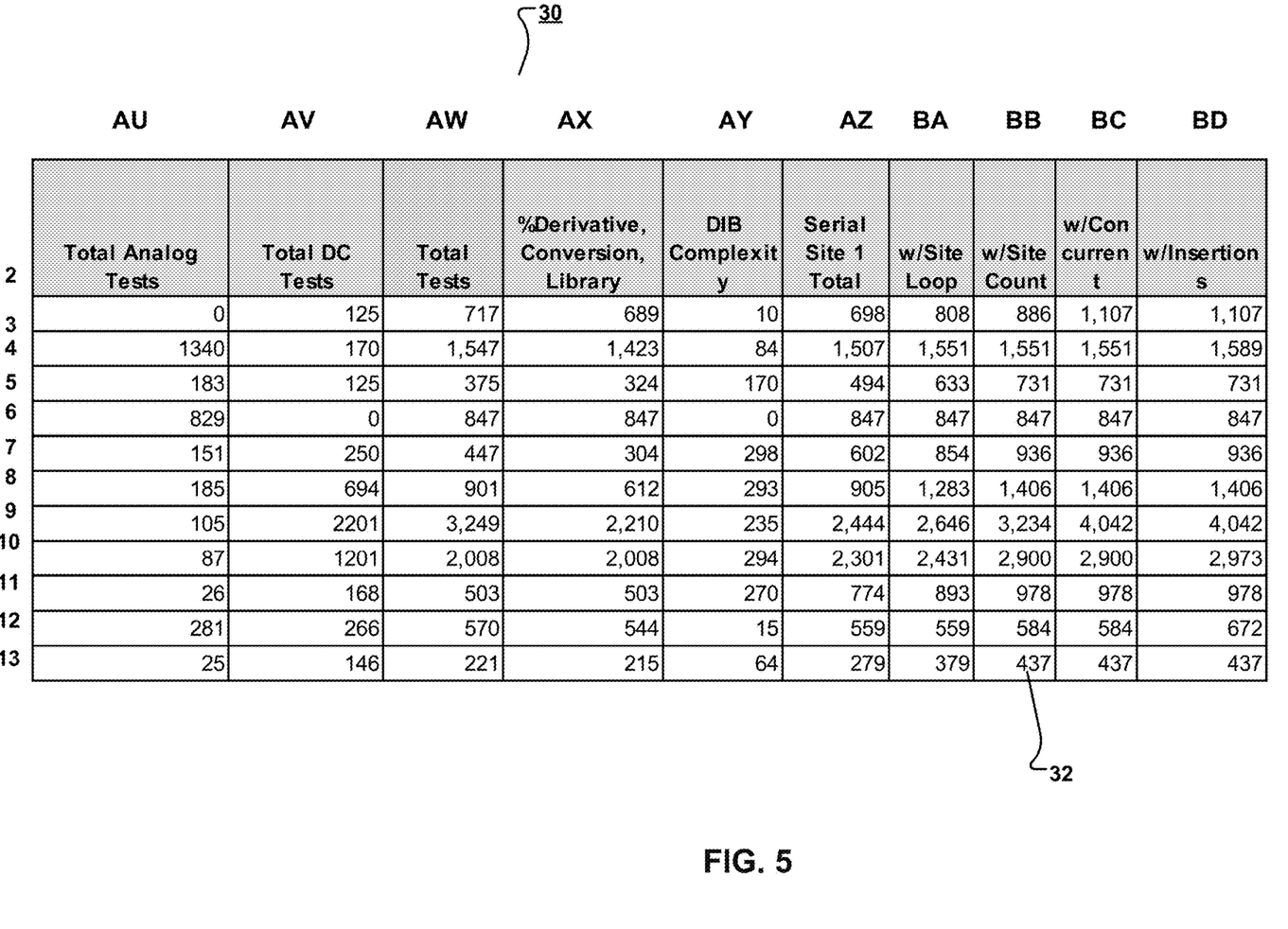

In table 30, this value is shown in column AU. The preceding equation expressed in terms of row, column, and/or weight values in Excel® equation format is as follows:
SUM(AG$1*AG3,AH$1*AH3,AI$1*AI3,AJ$1*AJ3, AK$1*AK3,AL$1*AL3,AM$1*AM3)

Total DC Tests Value:
(1.00)*(# of DC Parametric Tests)+(1.00)*(# of DC Continuous Power Tests)+(2.00)*(# of DC Dynamic Power Tests)+(1.20)*(# of DC Trim Tests)

In table 30, this value is shown in column AV. The preceding equation expressed in terms of row, column, and/or weight values in Excel® equation format is as follows: SUM (AN$1*AN3,AO$1*AO3,AQ$1*AQ3,AS$1*AS3)

Total Tests Value:
(Total Digital Test Value)+(Total Analog Test Value)+(Total DC Tests Value)

In table 30, this value is shown in column AW. The preceding equation expressed in terms of row, column, and/or weight values in Excel® equation format is as follows:
SUM(AT3:AV3)

% Derivative, Conversion, Library Value:
if (Test Program Origin="New Test Program" then perform the following operation to obtain the value: (Total Tests Value)*(1−(Derivative Reuse %)*0.45); or
if (Test Program Origin="Conversion Non-Teradyne" then perform the following operation to obtain the value: (Total Tests Value)*(1−(Derivative Reuse %)*0.2); or
if (Test Program Origin="Conversion Teradyne Diff. SW Platform" then perform the following operation to obtain the value: (Total Tests Value)*(1−(Derivative Reuse %)*0.3); or
if (Test Program Origin="Conversion Teradyne Same SW Platform" then perform the following operation to obtain the value: (Total Tests Value)*(1−(Derivative Reuse %)*0.4); or
if (Test Program Origin="Derivative Same Tester" then perform the following operation to obtain the value: (Total Tests Value)*(1−(Derivative Reuse %)*0.5);
otherwise the value is 0.

In table 30, this value is shown in column AX. The preceding equation expressed in terms of row, column, and/or weight values in Excel® equation format is as follows:
IF(Q3="New Test Program",AW3*(1−O3*0.45), IF(Q3="Conversion Non-Teradyne",AW3*(1−O3*0.2), IF(Q3="Conversion Teradyne Diff. SW Platform",AW3*(1-03*0.3), IF(Q3="Conversion Teradyne Same SW Platform", AW3*(1−O3*0.4), IF(Q3="Derivative Same Tester",AW3*(1−O3*0.5),0)))))

DIB Complexity Value:
[1−(0.80)*(Hardware Reuse %)]*[(1.33)[(Total Relays)+(3.00)*(# of Specialized Circuit Blocks)]

In table 30, this value is shown in column AY. The preceding equation expressed in terms of row, column, and/or weight values in Excel® equation format is as follows:
(1−(P$1*P3))*(V$1*V3+W$1*W3)

Serial Site 1 Total Value:
(% Derivative, Conversion, Library Value)+(DIB Complexity Value)

In table 30, this value is shown in column AZ. The preceding equation expressed in terms of row, column, and/or weight values in Excel® equation format is as follows:
AX3+AY3

With (w/) Site Loop Value:
(Serial Site 1 Total Value)+(1.75)*(# of Serial Site Loops)

In table 30, this value is shown in column BA. The preceding equation expressed in terms of row, column, and/or weight values in Excel® equation format is as follows:
AZ3+(Y$1*Y3)

With (w/) Site Count Value:
(DIB Complexity Value)+[(With Site Loop Value)*(0.3) ((Site Count)$^{1/5}$−1))]

In table 30, this value is shown in column BB. The preceding equation expressed in terms of row, column, and/or weight values in Excel® equation format is as follows:
BA3+(BA3*(0.3*(U3^(1/5)−1)))

With (w/) Concurrent Test:
if (Concurrent Test Value="Yes") then perform the following operation to obtain the value: (1.25)*(w/Site Count Value);
otherwise the value is (w/Site Count Value)

Figure 6:
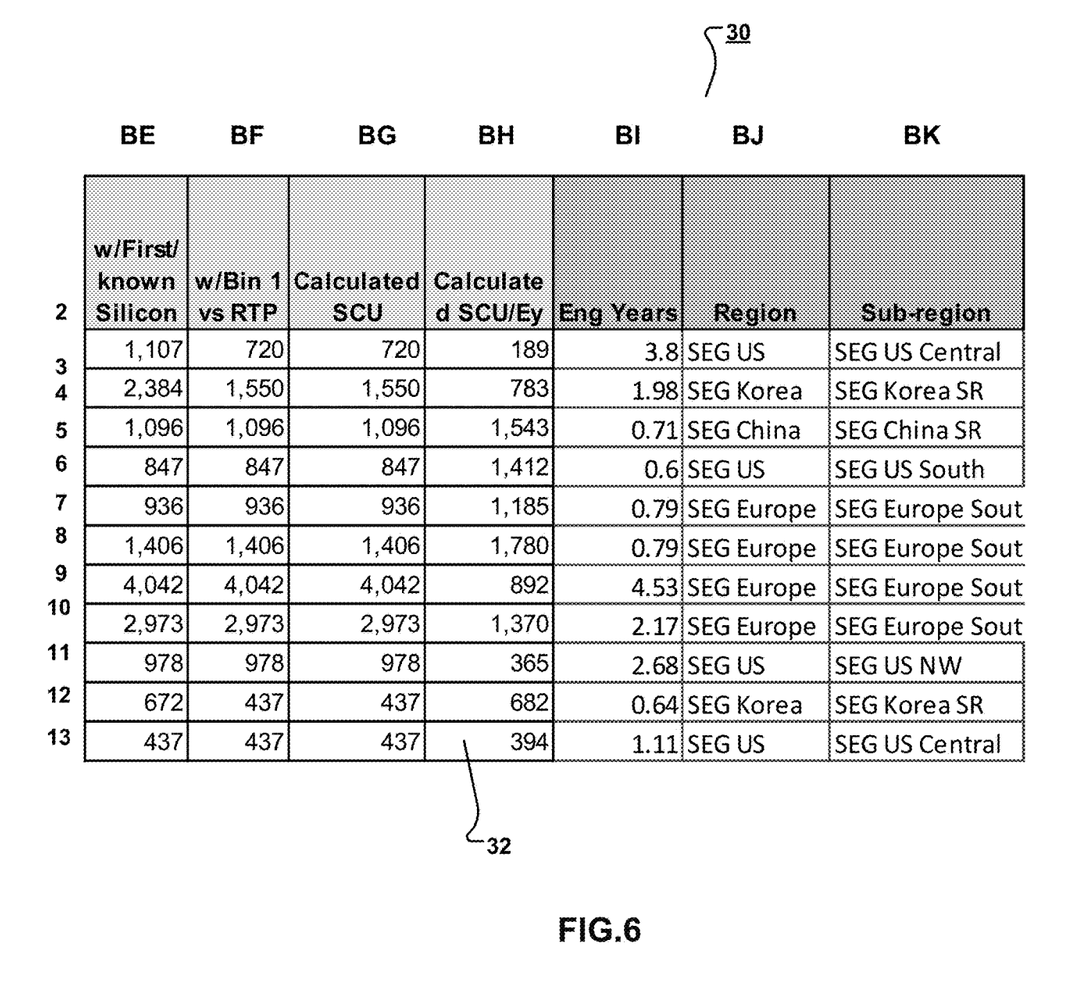

In table 30, this value is shown in column BC. The preceding equation expressed in terms of row, column, and/or weight values in Excel® equation format is as follows:
IF(T3="Yes",T$1*BB3,BB3)
With (w/) Insertions Value:
(w/Concurrent Test Value)*(1+[(1.03-1)*((# of Test Insertions)−1)])
In table 30, this value is shown in column BD. The preceding equation expressed in terms of row, column, and/or weight values in Excel® equation format is as follows:
BC3*(1+((X$1−1)*(X3−1)))
With (w/) First Known Silicon Value:
if (Device Known Good="No") then perform the following operation to obtain the value: (1.5)*(w/Insertions Value); otherwise the value is (w/Insertions Value)
In table 30, this value is shown in column BE. The preceding equation expressed in terms of row, column, and/or weight values in Excel® equation format is as follows:
IF(S3="No",S$1*BD3,BD3)
With (w/) Bin 1 versus (vs) RTP Value:
if (Bin 1—"Yes") then perform the following operation to obtain the value: (0.65)*(w/First Known Silicon Value); otherwise the value is (w/First Known Silicon Value)
In table 30, this value is shown in column BF. The preceding equation expressed in terms of row, column, and/or weight values in Excel® equation format is as follows:
IF(R3="Yes",R$1*BE3,BE3)
Calculated SCU Value: (w/Bin 1 vs RTP Value)
In table 30, this value is shown in column BG. The preceding equation expressed in terms of row, column, and/or weight values in Excel® equation format is as follows: BF3
Calculated SCU/Ey (Engineering Year) Value:
(Calculated SCU Value)/(Number of Engineering Years to Write the Test Program) Time values other than years may be used, such as engineering hours or engineering days to develop a test program.
In table 30, this value is shown in column BH. The preceding equation expressed in terms of row, column, and/or weight values in Excel® equation format is as follows: BG/BI3

Table 30, column BI show the number of engineering years taken by a test engineer to develop a test program in each row. These hours may, or may not, factor-in use of one or more specific tools used by the test engineer to develop the test program. So, for example, a test engineer using different tools would produce results having different values in column BI. Columns BJ and BK of table 30 show regions and sub-regions where testing may be performed.

Figure 7:
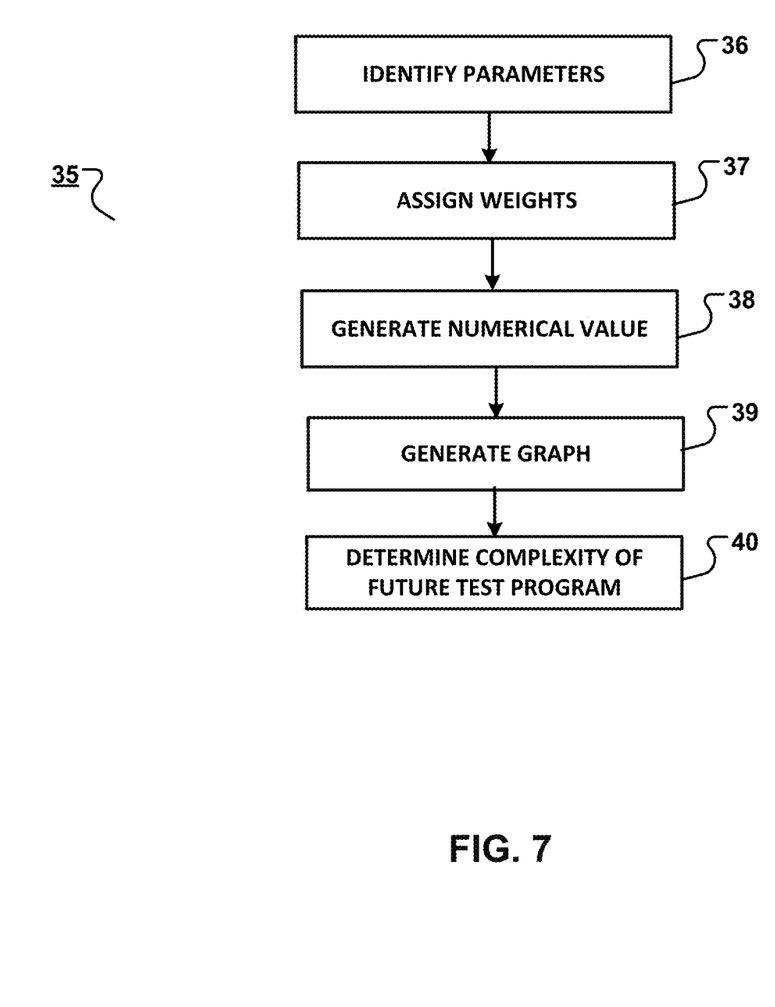
FIG. 7 is a flowchart showing operations included in an example process for determining the complexity of a test program.

FIG. 7 shows operations included in an example process 35 for generating a numerical value indicative of a complexity of the test program and for using that numerical value to obtain information about an amount of effort needed to develop future test programs. Process 35 includes identifying (36) parameters associated with a test program. The parameters affect the complexity of the test program—for example, how difficult it is to write, to debug, and/or to revise the test program. The parameters may be determined empirically based, for example, on observations and feedback from test engineers who develop test programs. The parameters may be determined empirically based, for example, on observations and analyses of tasks performed by tools used to develop the test program. The parameters may be based on a DUT to be tested by the test program, a DIB used in the test system, the test system itself, and other factors, as described above. Weights such as those described herein are assigned (37) to the parameters based, for example, on their perceived effect of the parameters on the complexity of the test program. The weights may be used to emphasize or to deemphasize the importance of one, some, or all of the parameters.

Process 35 includes generating (38) a numerical value indicative of a complexity of the test program based on the parameters, the weights, and equations that use the parameters and the weights. Examples of equations to generate the SCU, which is indicative of a complexity of the test program, are described herein.

Figure 8:
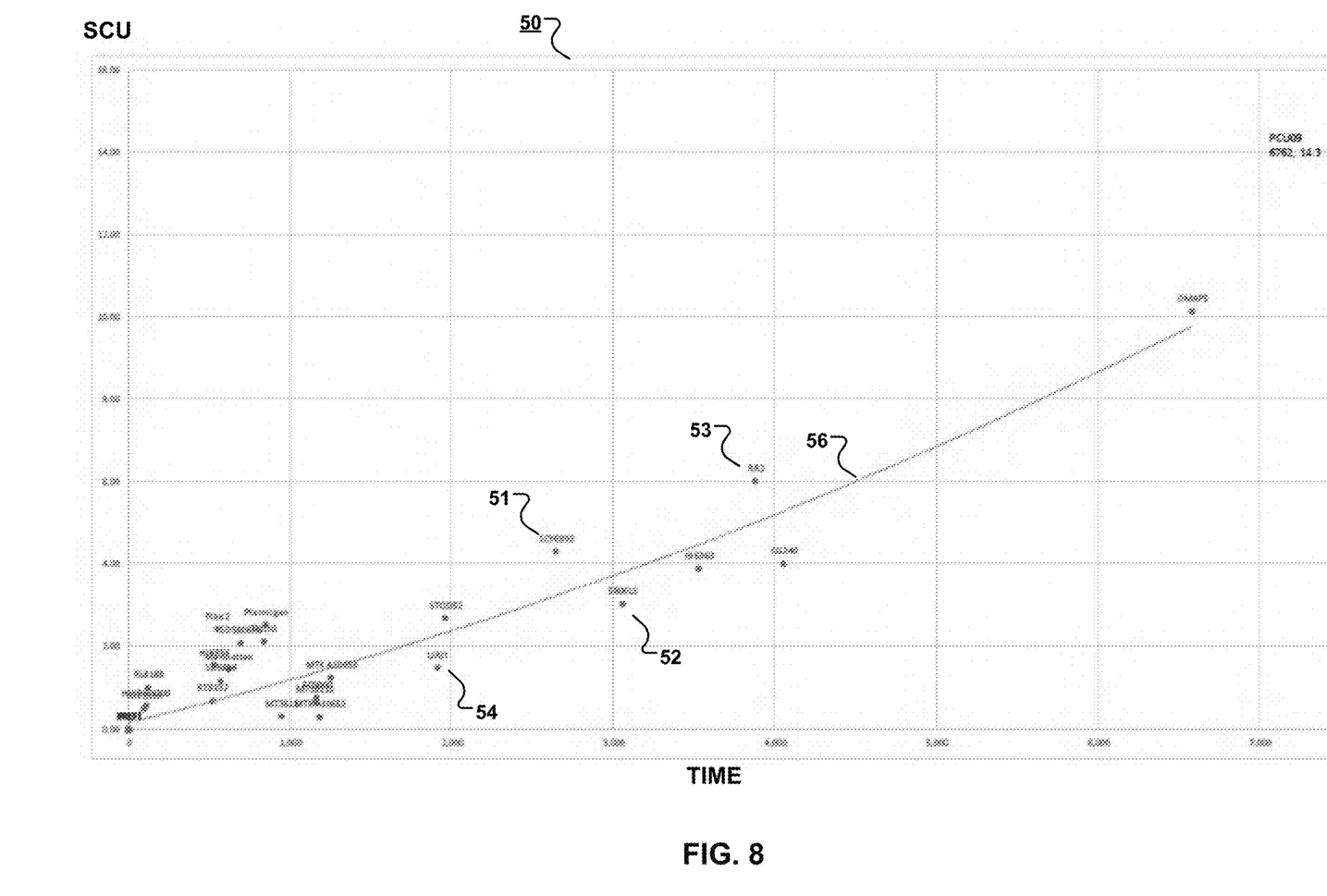
FIG. 8 is a graph showing numerical values indicative of complexities of multiple test programs plotted against test program development time.

The SCU may be used to obtain information about the amount of effort needed to develop future test programs. For example, a graph may be generated (39) that plots SCUs against times that it takes an entity, such as a test engineer or the test engineer using a particular development tool, to develop the test program. The graph may include multiple SCU values for different test programs plotted against corresponding times to develop the test programs. FIG. 8 shows an example of such graph 50. A trend line may be fitted to the SCU data points to identify a relationship between SCUs and development time. The trend may be used to predict an amount of effort that will be required by an entity, such as a test engineer or development tool, tasked to develop a future test program actually to develop the future test program.

Referring to FIG. 8, graph 50 shows SCUs for example test programs—such as Device2 51, Device31 52, Device18 53, Device 6 54, and the others shown—plotted against the number of engineering years taken to develop those test programs. To determine (40) the complexity of a future test program—for example, a test program to be developed—an existing test program having parameters that are expected to be similar to the parameters of the future test program is identified. The SCU of the existing test program may be used to predict the complexity of the future test program. Resources, such as test engineering time or test development tools, may then be allocated based on the expected complexity of the future test program.

Determining (40) the complexity of a future test program may include interpolating between the SCUs of two existing test programs having parameters similar to the future test program. For example, two existing test programs may each have a percentage of parameters that are identical or similar to the future test program. In this example, two existing test programs may each have parameters that are 80% similar to those of the future test program, 70% similar to those of the future test program, 60% similar to those of the future test program, and so forth. In that case, a location on trend line 56 may be determined that is between the SCUs of the two existing test programs. The engineering hours associated with that location may be used as the prediction for the engineering hours needed to develop the future test program.

Determining (40) the complexity of a future test program may include determining whether the numerical value of a known test program having parameters similar to those of an existing test program is an outlier on trend line 56 of FIG. 8. If so, then the prediction as to the amount of effort needed to develop the test program may be considered less accurate. In cases such as this, the allocation of resources for development of the test program may be increased to address added uncertainty.

In some implementations, the SCU may be used to obtain information about a tool used to develop the test programs. Examples of tools used to develop test programs include, but are not limited to, computer programs, computing systems, wireless devices, and DIBs or other interface boards or hardware. One of more such tools may be switched-out or changed during development. The change in tool(s) may be reflected in the SCU for the test program. For example, different DIBs may result in different SCUs for the same test program. This information may be used to identify tools that reduce that amount of effort required to develop a test program. Those tools may be used in the future to achieve comparable results with less effort.

The processes described herein may be performed by computing systems or any other appropriate computing device. The processes can be executed, at least in part, using one or more computer program products, e.g., one or more computer program tangibly embodied in one or more information carriers, such as one or more non-transitory machine-readable media, for execution by, or to control the operation of, one or more data processing apparatus, e.g., a programmable processor, a computer, multiple computers, and/or programmable logic components.

A computer program can be written in any form of programming language, including compiled or interpreted languages, and it can be deployed in any form, including as a stand-alone program or as a module, component, subroutine, or other unit suitable for use in a computing environment. A computer program can be deployed to be executed on one computer or on multiple computers at one site or distributed across multiple sites and interconnected by a network.

Actions associated with implementing all or part of the processes can be performed by one or more programmable processors executing one or more computer programs to perform the functions described herein. All or part of the processes can be implemented using special purpose logic circuitry, e.g., an FPGA (field programmable gate array) and/or an ASIC (application-specific integrated circuit).

Processors suitable for the execution of a computer program include, by way of example, both general and special purpose microprocessors, and any one or more processors of any kind of digital computer. Generally, a processor will receive instructions and data from a read-only storage area or a random access storage area or both. Elements of a computer (including a server) include one or more processors for executing instructions and one or more storage area devices for storing instructions and data. Generally, a computer will also include, or be operatively coupled to receive data from, or transfer data to, or both, one or more machine-readable storage media, such as mass storage devices for storing data, e.g., magnetic, magneto-optical disks, or optical disks. Machine-readable storage media suitable for embodying computer program instructions and data include all forms of non-volatile storage area, including by way of example, semiconductor storage area devices, e.g., EPROM, EEPROM, and flash storage area devices; magnetic disks, e.g., internal hard disks or removable disks; magneto-optical disks; and CD-ROM and DVD-ROM disks.

Elements of different implementations described herein may be combined to form other embodiments not specifically set forth above. Elements may be left out of the structures described herein without adversely affecting their operation. Furthermore, various separate elements may be combined into one or more individual elements to perform the functions described herein.

What is claimed is:

1. A method performed by one or more processing devices, comprising:
   identifying parameters associated with a test program, the parameters being based on at least one of a device under test (DUT) to be tested by the test program or a type of test to be performed on the DUT by the test program;
   assigning weights to the parameters;
   generating a numerical value for the test program based on the parameters, the weights, and equations that are based on the parameters and the weights, the numerical value being indicative of a complexity of the test program; and
   using the numerical value to obtain information about effort needed to develop a future test program;
   wherein obtaining the information comprises:
      generating a graph that plots multiple numerical values for test programs against corresponding times to develop the test programs;
      identifying the numerical value for the test program on the graph, the test program having at least a predefined amount of similarity to the future test program; and
      determining an amount of effort, including an allocation of resources, to develop the future test program based on a proximity of the numerical value for the test program to a trend line of the graph.

2. The method of claim 1, wherein obtaining the information comprises:
   dividing the numerical value by an amount of time taken to develop the test program to produce a numerical value per unit time.

3. The method of claim 1, further comprising:
   using the numerical value to obtain information about a tool used to develop the future test program;
   wherein obtaining the information comprises determining whether the numerical value changes relative to a different numerical value for a different tool used to develop the future test program.

4. The method of claim 1, wherein the parameters relate to operation of the test program on a test system.

5. The method of claim 1, wherein the parameters relate to a test system on which the test program is operated.

6. The method of claim 1, wherein generating the numerical value comprises executing processes based on digital testing, analog testing, and direct current (DC) testing.

7. The method of claim 1, wherein generating the numerical value comprises performing an operation that is based on a complexity of a device interface board included on a test system configured to execute the test program.

8. The method of claim 1, wherein generating the numerical value comprises performing an operation that is based on serial site loops employed as part of a testing process implemented by the test program.

9. The method of claim 1, wherein generating the numerical value comprises performing an operation that is based on insertions employed as part of a testing process implemented by the test program.

10. The method of claim 1, wherein generating the numerical value comprises performing an operation that is based on whether one or more devices under test are known-good.

11. The method of claim 1, wherein generating the numerical value comprises performing an operation that is based on whether one or more devices under test are released to production.

12. The method of claim 1, wherein at least one of the parameters has a linear impact on the numerical value.

13. The method of claim 1, wherein at least one of the parameters has a non-linear impact on the numerical value.

14. The method of claim 1, further comprising:
   using the numerical value to obtain information about at least one of a tool used to develop the test program or an entity tasked to develop the test program.

15. The method of claim 14, wherein the entity comprises an engineer.

16. The method of claim 1, wherein the DUT comprises at least one of a digital device, a radio frequency wireless device, a mixed signal device, or a power device.

17. One or more non-transitory storage devices storing instructions that are executable by one or more processing devices to perform operations comprising:
 identifying parameters associated with a test program, the parameters being based on at least one of a device under test (DUT) to be tested by the test program or a type of test to be performed on the DUT by the test program;
 assigning weights to the parameters;
 generating a numerical value for the test program based on the parameters, the weights, and equations that are based on the parameters and the weights, the numerical value being indicative of a complexity of the test program; and
 using the numerical value to obtain information about effort needed to develop a future test program;
 wherein obtaining the information comprises:
  generating a graph that plots multiple numerical values for test programs against corresponding times to develop the test programs;
  identifying the numerical value for the test program on the graph, the test program having at least a pre-defined amount of similarity to the future test program; and
  determining an amount of effort, including an allocation of resources, to develop the future test program based on a proximity of the numerical value for the test program to a trend line of the graph.

18. The one or more non-transitory storage devices of claim 17, wherein obtaining the information comprises:
 dividing the numerical value by an amount of time taken to develop the test program to produce a numerical value per unit time.

19. The one or more non-transitory storage devices of claim 17, wherein the operations comprise using the numerical value to obtain information about a tool used to develop the future test program; and
 wherein obtaining the information comprises determining whether the numerical value changes relative to a different numerical value for a different tool used to develop the future test program.

20. The one or more non-transitory storage devices of claim 17, wherein the parameters relate to operation of the test program on a test system.

21. The one or more non-transitory storage devices of claim 17, wherein the parameters relate to a test system on which the test program is operated.

22. The one or more non-transitory storage devices of claim 17, wherein generating the numerical value comprises executing processes based on digital testing, analog testing, and direct current (DC) testing.

23. The one or more non-transitory storage devices of claim 17, wherein generating the numerical value comprises performing an operation that is based on a complexity of a device interface board included on a test system configured to execute the test program.

24. The one or more non-transitory storage devices of claim 17, wherein generating the numerical value comprises performing an operation that is based on serial site loops employed as part of a testing process implemented by the test program.

25. The one or more non-transitory storage devices of claim 17, wherein generating the numerical value comprises performing an operation that is based on insertions employed as part of a testing process implemented by the test program.

26. The one or more non-transitory storage devices of claim 17, wherein generating the numerical value comprises performing an operation that is based on whether one or more devices under test are known-good.

27. The one or more non-transitory storage devices of claim 17, wherein generating the numerical value comprises performing an operation that is based on whether one or more devices under test are released to production.

28. The one or more non-transitory storage devices of claim 17, wherein at least one of the parameters has a linear impact on the numerical value.

29. The one or more non-transitory storage devices of claim 17, wherein at least one of the parameters has a non-linear impact on the numerical value.

30. The one or more non-transitory storage devices of claim 17, wherein the operations comprise using the numerical value to obtain information about at least one of a tool used to develop the test program or an entity tasked to develop the test program.

31. The one or more non-transitory storage devices of claim 30, wherein the entity comprises an engineer.

32. The one or more non-transitory storage devices of claim 17, wherein the DUT comprises at least one of a digital device, a radio frequency wireless device, a mixed signal device, or a power device.

33. A system comprising:
 memory storing instructions that are executable; and
 one or more processing devices to execute the instructions to perform operations comprising:
  identifying parameters associated with a test program, the parameters being based on at least one of a device under test (DUT) to be tested by the test program or a type of test to be performed on the DUT by the test program;
  assigning weights to the parameters;
  generating a numerical value for the test program based on the parameters; the weights, and equations that are based on the parameters and the weights, the numerical value being indicative of a complexity of the test program; and
  using the numerical value to obtain information about effort needed to develop a future test program;
  wherein obtaining the information comprises:
   generating a graph that plots multiple numerical values for test programs against corresponding times to develop the test programs;
   identifying the numerical value for the test program on the graph, the test program having at least a pre-defined amount of similarity to the future test program; and
   determining an amount of effort, including an allocation of resources, to develop the future test program based on a proximity of the numerical value for the test program to a trend line of the graph.

34. The system of claim 33, wherein generating the numerical value comprises performing an operation that is based on a complexity of a device interface board included on a test system configured to execute the test program.

35. The system of claim 33, wherein generating the numerical value comprises performing an operation that is based on serial site loops employed as part of a testing process implemented by the test program.

36. The system of claim 33, wherein generating the numerical value comprises performing an operation that is based on whether one or more devices under test are known-good.

* * * * *